(12) United States Patent
Chao et al.

(10) Patent No.: US 8,246,325 B2
(45) Date of Patent: Aug. 21, 2012

(54) MINIATURIZED LIQUID COOLING APPARATUS AND ELECTRONIC DEVICE INCORPORATING THE SAME

(75) Inventors: Chien-Yu Chao, Taipei Hsien (TW); Yen-Chih Chen, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 311 days.

(21) Appl. No.: 12/778,072

(22) Filed: May 11, 2010

(65) Prior Publication Data

US 2011/0157827 A1 Jun. 30, 2011

(30) Foreign Application Priority Data

Dec. 29, 2009 (TW) ............................... 98145685 A

(51) Int. Cl.
*F04B 35/04* (2006.01)
*H05K 7/20* (2006.01)
*B05B 1/08* (2006.01)
(52) U.S. Cl. ................... 417/413.2; 361/699; 239/102.2
(58) Field of Classification Search .................... 62/310, 62/314; 417/413.1, 413.2; 361/679.53, 699; 165/80.4–80.5, 104.33; 257/714; 174/15.1; 239/102.1, 102.2
See application file for complete search history.

(56) References Cited

U.S. PATENT DOCUMENTS

| 5,349,831 | A  | * | 9/1994  | Daikoku et al. | 62/376   |
| 7,841,843 | B2 | * | 11/2010 | Cho et al.     | 417/413.1 |
| 2007/0040043 | A1 | * | 2/2007  | Onozawa        | 239/102.1 |
| 2009/0167109 | A1 | * | 7/2009  | Tomita et al.  | 310/317  |
| 2009/0232682 | A1 | * | 9/2009  | Hirata et al.  | 417/413.2 |
| 2009/0232683 | A1 | * | 9/2009  | Hirata et al.  | 417/413.2 |
| 2010/0074775 | A1 | * | 3/2010  | Yamamoto et al.| 417/413.2 |

* cited by examiner

*Primary Examiner* — Devon Kramer
*Assistant Examiner* — Bryan Lettman
(74) *Attorney, Agent, or Firm* — Altis Law Group, Inc.

(57) ABSTRACT

A liquid cooling apparatus for cooling an inversely mounted electronic component, includes a casing defining a receiving room therein, a diaphragm, a partition plate forming a nozzle thereon, and a piezoelectric element attached to the diaphragm in such a manner that a vibrating direction thereof is perpendicular to the diaphragm. The diaphragm is arranged in the receiving room and divides the receiving room into a top first chamber and a bottom second chamber isolated from each other. The partition plate is arranged in the first chamber and divides the first chamber into an upper region and a lower region. The lower region is filled with a working fluid. When the diaphragm is driven to vibrate upwardly by the piezoelectric element, the diaphragm pushes the working fluid in the lower region of the first chamber to the upper region of the first chamber via the nozzle.

14 Claims, 4 Drawing Sheets

MINIATURIZED LIQUID COOLING APPARATUS AND ELECTRONIC DEVICE INCORPORATING THE SAME

BACKGROUND

1. Technical Field

The disclosure generally relates to liquid cooling apparatuses; and more particularly to a miniaturized liquid cooling apparatus, and an electronic device incorporating the miniaturized liquid cooling apparatus.

2. Description of Related Art

In an electronic device such as a notebook computer, a mainboard is usually mounted in a casing of the notebook computer, with main electronic components such as a central processing unit (CPU) and a video graphics array chip connected to the mainboard. In addition, a liquid cooling device is used for cooling the CPU mounted on the mainboard. Generally, the liquid cooling device includes a heat absorbing member attached to the CPU for absorbing heat generated by the CPU, a heat dissipation member dissipating the heat to the surrounding environment, a pump driving working fluid to circulate between the heat absorbing member and the heat dissipation member, and a plurality of tubes connecting the heat absorbing member and the heat dissipation member. When the electronic components are disposed on a top side of the mainboard and the notebook computer is oriented on a flat support (such as a desktop), working fluid accommodated in the heat absorbing member can maintain uniform contact with a heat-absorbing (i.e. bottom) plate of the heat absorbing member which in turn is in contact with the CPU. This is due to the effect of gravity. As a result, the heat absorbing member can efficiently take heat away from the CPU, and the liquid cooling device can properly cool the electronic component.

However, when the electronic component is inversely mounted on a bottom side of the mainboard and the notebook computer is oriented on a flat support, the working fluid in the heat absorbing member cannot contact the heat-absorbing plate of the heat absorbing member unless the working fluid is fully filled in the heat absorbing member. If the working fluid is not fully filled in the heat absorbing member, the liquid cooling device cannot properly cool the electronic component. Further, the pump and the tubes occupy a large volume, which increases the size of the liquid cooling device. This goes against the need for compact size in electronic products.

What is needed, therefore, is a liquid cooling apparatus to overcome the above-described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
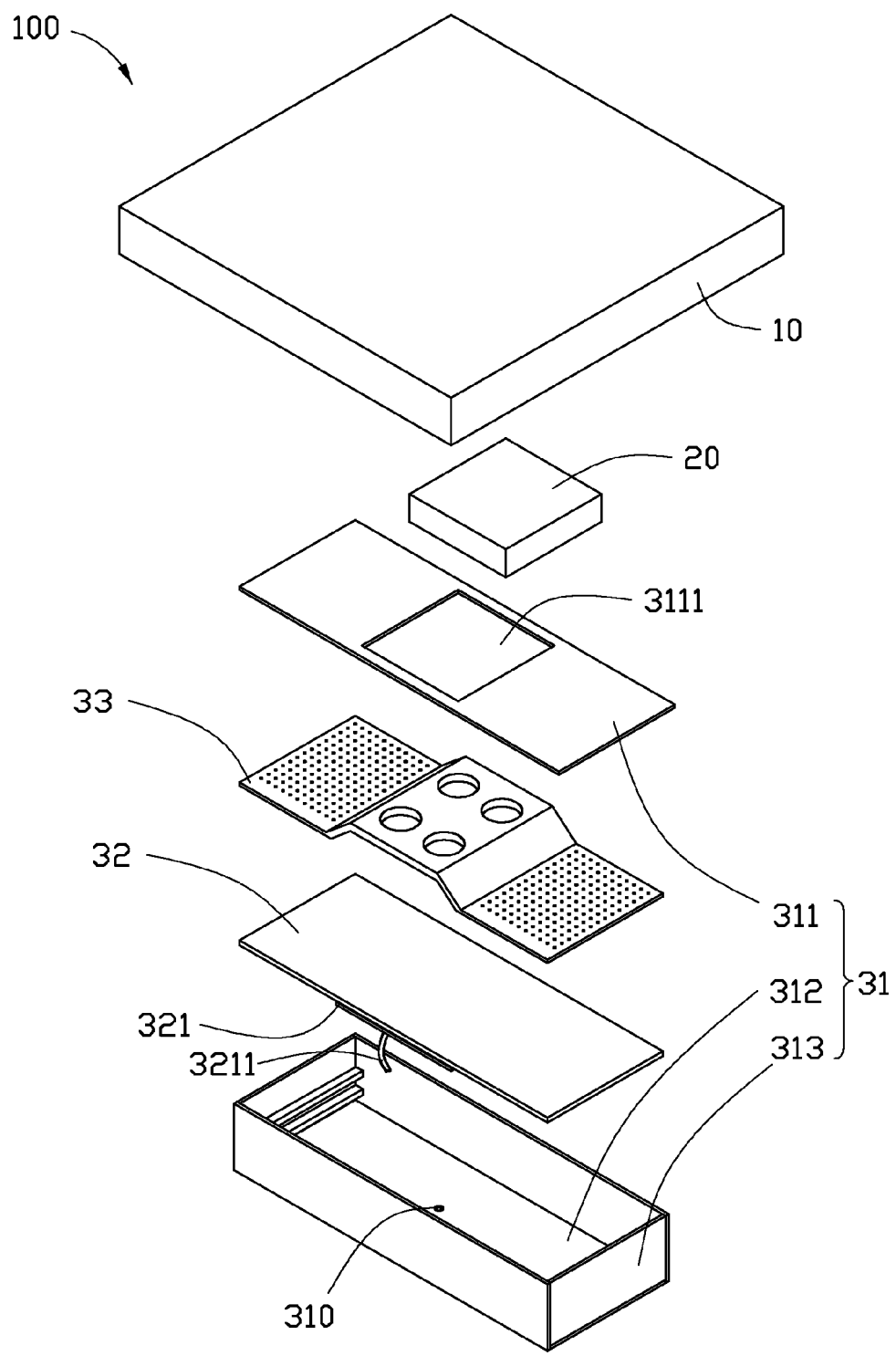
FIG. 1 is an exploded, isometric view of an electronic device in accordance with an exemplary embodiment of the present disclosure.
Figure 2:
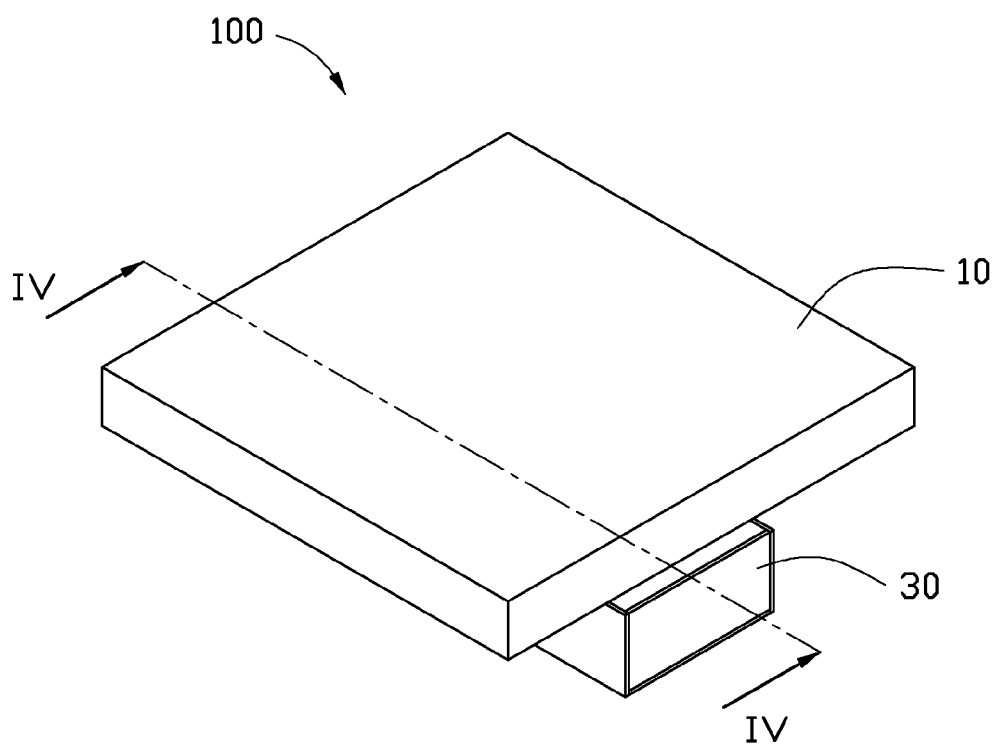
FIG. 2 is an assembled view of the electronic device of FIG. 1.

Referring to FIGS. 1-2, an electronic device 100 according to an exemplary embodiment of the present disclosure is shown. The electronic device 100 includes a mainboard 10, an electronic component 20 such as a central processing unit, and a miniaturized liquid cooling apparatus 30 for cooling the electronic component 20. The electronic component 20 is mounted on the mainboard 10, and is located at a bottom side of the mainboard 10. The liquid cooling apparatus 30 is located under the bottom side of the mainboard 10, and is attached to the electronic component 20. The liquid cooling apparatus 30 includes a casing 31, and a diaphragm 32 and a partition plate 33 received in the casing 31.

Figure 4:
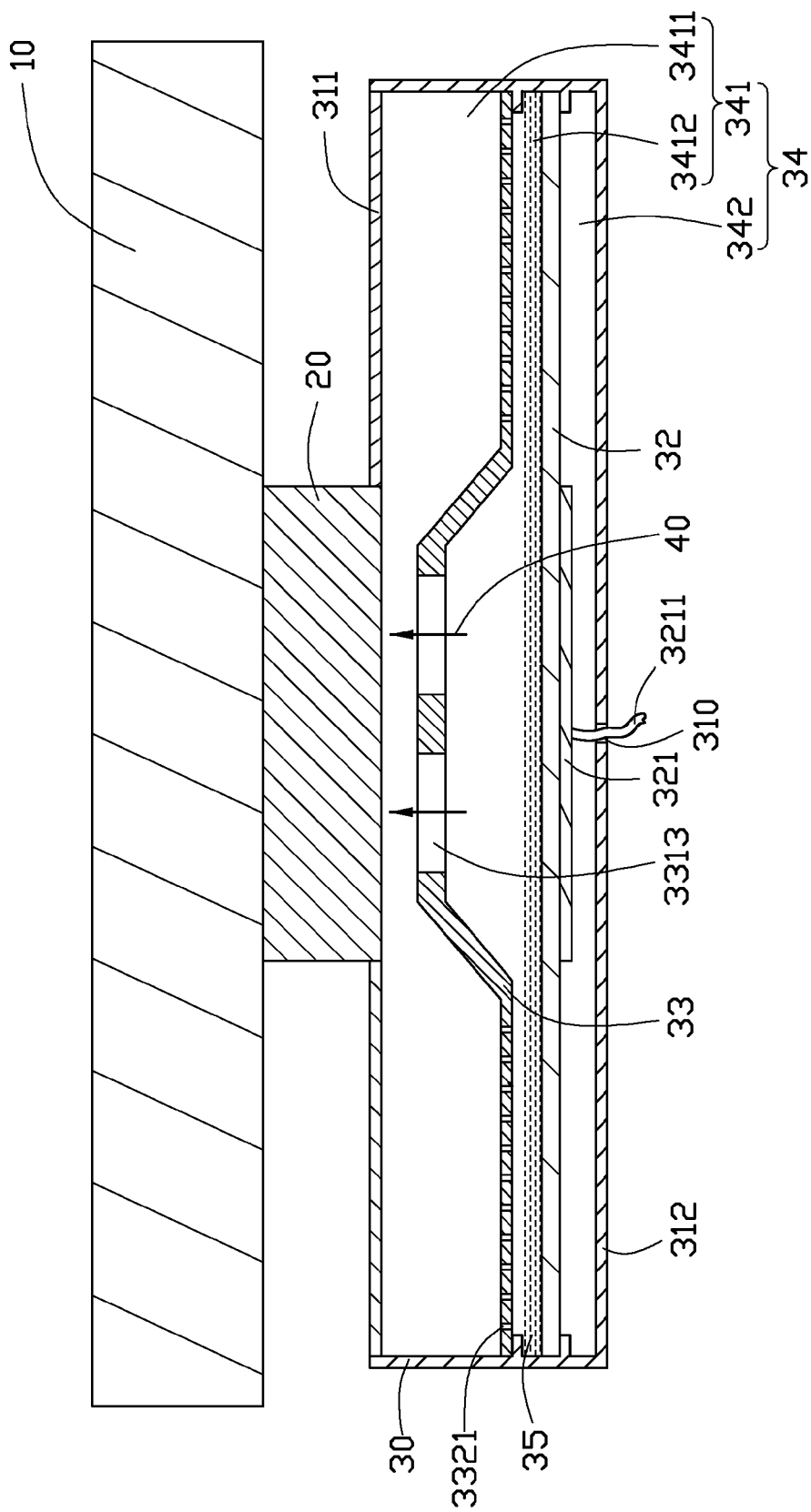
FIG. 4 is a cross-sectional view of the electronic device of FIG. 2, taken along a line IV-IV thereof.

Referring also to FIG. 4, the casing 31 is a rectangular box. The casing 31 includes a top plate 311, a bottom plate 312, and a sidewall 313 connected between the top plate 311 and the bottom plate 312. The casing 31 defines a receiving room 34 therein. The diaphragm 32 is arranged in the receiving room 34 of the casing 31. The receiving room 34 of the casing 31 is divided into a first chamber 341 and a second chamber 342 by the diaphragm 32. The first chamber 341 and the second chamber 342 are isolated from each other, and are located at top and bottom sides of the diaphragm 32, respectively.

The diaphragm 32 has a rectangular shape. The diaphragm 32 is made of elastic material, such as rubber, flexible resin or a thin metal sheet. A piezoelectric element 321 is attached to a middle of a bottom surface of the diaphragm 32 in such a manner that the piezoelectric element 321 vibrates along directions perpendicular to the diaphragm 32 for driving the diaphragm 32 to vibrate up and down when a voltage is applied to the piezoelectric element 321. The piezoelectric element 321 is made of piezoelectric ceramic. A through hole 310 is defined in the bottom plate 312 of the casing 31 for extension of wires 3211 therethrough to electrically connect the piezoelectric element 321 with an external power supply (not shown).

The partition plate 33 is arranged in the first chamber 341 of the casing 31. The partition plate 33 is spaced from the diaphragm 32 by a predetermined distance, and divides the first chamber 341 into an upper region 3411 far from the diaphragm 32 and a lower region 3412 adjacent to the diaphragm 32. The lower region 3412 of the first chamber 341 is filled with a working fluid 35. In this description, unless the context indicates otherwise, it is assumed that the working fluid 35 is in liquid form.

Figure 3:
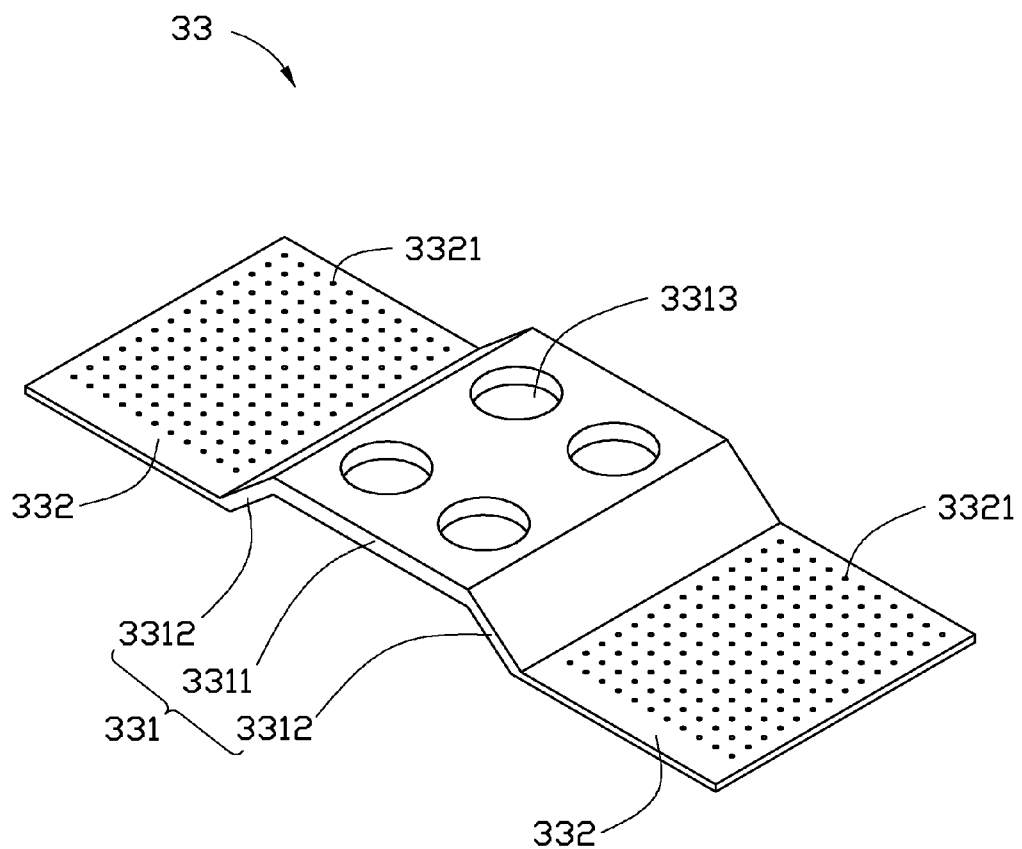
FIG. 3 is an isometric, enlarged view of a partition plate of a miniaturized liquid cooling apparatus of the electronic device of FIG. 1.

Referring also to FIG. 3, the partition plate 33 includes a tapered nozzle 331 protruding upward towards the top plate 311 of the casing 31, and two wings 332 extending horizontally from two opposite sides of the nozzle 331, respectively. Thus the nozzle 331 is located at a middle portion of the partition plate 33, over the piezoelectric element 321. The nozzle 331 includes a rectangular top portion 3311, and two connecting portions 3312 extending down and outward from two opposite sides of the top portion 3311 to connect the two wings 332, respectively. A plurality of jetting holes 3313 are defined through the top portion 3311 of the nozzle 331, communicating the upper region 3411 with the lower region 3412. A multiplicity of tiny reflux holes 3321 are defined through each of the two wings 332 of the partition plate 33, communicating the upper region 3411 with the lower region 3412. The reflux holes 3321 are thus located at two sides of the nozzle 331. The partition plate 33 is preferably made of porous material with a multiplicity of capillary holes (not shown).

In assembly, the liquid cooling apparatus 30 is arranged at the bottom side the mainboard 10, and contacts the electronic component 20 via the top plate 311 of the casing 31. In this embodiment, the top plate 311 of the casing 31 defines a though hole 3111 in a middle portion thereof corresponding to the nozzle 331 of the partition plate 33. A bottom portion of the electronic component 20 is received in the through hole of the top plate 311, and is hermetically joined to the top plate 311 in a press-fit manner or by soldering. In particular, the electronic component 20 and the liquid cooling apparatus 30 can be assembled together before the electronic component 20 is mounted on the mainboard 10.

Referring back to FIG. 4, in operation, the external power supply provides an alternating voltage to the piezoelectric element 321 via the wires 3211. As a result of the reverse piezoelectric effect, the piezoelectric element 321 produces alternate expanding and shrinking deformations, driving the diaphragm 32 to vibrate up and down. When the piezoelectric element 321 drives the diaphragm 32 to vibrate upwardly, the diaphragm 32 pushes the working fluid 35 in the lower region 3412 of the first chamber 341 to move upwardly, thereby producing a jet current (indicated by arrow 40 in FIG. 4) of the working fluid 35 since the nozzle 331 is convergent. The jet current of working fluid 35 jets upwardly to a bottom surface of the electronic component 20 via the jetting holes 3313. When the jet current of the working fluid 35 reaches the bottom surface of the electronic component 20, a portion of the jet current of the working fluid 35 is changed into vapor after absorbing heat generated by the electronic component 20. Another portion of the jet current of the working fluid 35 is blocked by the bottom surface of the electronic component 20 to spatter in every direction, and then flows back to the lower region 3412 of the first chamber 341 via the reflux holes 3321 of the partition plate 33.

According to the alternating voltage, the piezoelectric element 321 drives the diaphragm 32 to periodically push the working fluid 35 in the lower region 3412 of the first chamber 341, thereby periodically producing a jet current of the working fluid 35 jetting to the electronic component 20 to continuously dissipate the heat generated by the electronic component 20. In addition, the jet current of the working fluid 35 lowers a temperature of at least some of the vapor in the upper region 3411 of the first chamber 341. At least some of such vapor in the upper region 3411 of the first chamber 341 is thus condensed back to working fluid 35, and the condensed working fluid 35 flows back to the lower region 3412 of the first chamber 341 via the reflux holes 3321 of the partition plate 33.

In the electronic device 100, the liquid cooling apparatus 30 periodically produces a forced current of working fluid 35 propagating from the lower region 3412 of the first chamber 341 to the nozzle 331 and jetting out from the nozzle 331 into the upper region 3411. Thus the liquid cooling apparatus 30 can be used for cooling the electronic component 20 which is inversely mounted on the bottom side of the mainboard 10. The bottom portion of the electronic component 20 is exposed to (and may extend into) the upper region 3411 of the first chamber 341. Thereby, the jet of working fluid 35 produced by the liquid cooling apparatus 30 can directly contact the electronic component 20 to cool the electronic component 20. Further, by supplying alternating voltages of different frequencies, the rate of the flow of the jet current of working fluid 35 can be adjusted to meet different cooling requirements.

Moreover, no tube is used in the liquid cooling apparatus 30, thus the liquid cooling apparatus 30 can have a small size.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A miniaturized liquid cooling apparatus, comprising:
   a casing defining a receiving room therein;
   a diaphragm arranged in the receiving room of the casing, the diaphragm dividing the receiving room of the casing into a first chamber and a second chamber isolated from each other, the first chamber and the second chamber being located at top and bottom sides of the diaphragm, respectively;
   a partition plate arranged in the first chamber of the casing and spaced from the diaphragm by a predetermined distance, the partition plate dividing the first chamber of the casing into an upper region spaced away from the diaphragm and a lower region adjacent to the diaphragm, the lower region of the first chamber being filled with a working fluid, the partition plate comprising a nozzle; and
   a piezoelectric element attached to the diaphragm in such a manner that the piezoelectric element can vibrate along directions substantially perpendicular to the top and bottom sides of the diaphragm when a voltage is applied to the piezoelectric element, wherein when the diaphragm is driven to vibrate upwardly by the piezoelectric element, the diaphragm pushes at least some of the working fluid in the lower region of the first chamber into the upper region of the first chamber via the nozzle,
   wherein the partition plate defines a plurality of reflux holes therein at two opposite sides of the nozzle, the reflux holes communicating the upper region with the lower region, and
   wherein the partition plate has two wings extending outward from the two opposite sides of the nozzle, the reflux holes being defined in the two wings.

2. The miniaturized liquid cooling apparatus of claim 1, wherein the nozzle is tapered and protrudes upward towards a top plate of the casing.

3. The miniaturized liquid cooling apparatus of claim 1, wherein the nozzle of the partition plate comprises a top portion, and two connecting portions extending down and outward from two opposite sides of the top portion, the top portion of the nozzle defining at least one jetting hole therein.

4. The miniaturized liquid cooling apparatus of claim 1, wherein a material of the partition plate is porous, with a plurality of capillary holes defining the reflux holes therein.

5. The miniaturized liquid cooling apparatus of claim 1, wherein the piezoelectric element is attached to a middle portion of the diaphragm, and the nozzle is located at a middle portion of the partition plate over the piezoelectric element.

6. The miniaturized liquid cooling apparatus of claim 1, wherein the casing is a rectangular box.

7. The miniaturized liquid cooling apparatus of claim 1, wherein the casing has a top plate facing the partition plate, the top plate defining a through hole therein corresponding to the nozzle of the partition plate and configured for receiving a heat source therein.

8. An electronic device, comprising:
a mainboard;
an electronic component located at a bottom side of the mainboard and mounted to the mainboard; and
a liquid cooling apparatus mounted to the electronic component, the liquid cooling apparatus comprising:
   a casing connected to the electronic component, the casing defining a receiving room therein;
   a diaphragm arranged in the receiving room of the casing, the diaphragm dividing the receiving room of the casing into a first chamber and a second chamber isolated from each other, the first chamber and the second chamber being located at top and bottom sides of the diaphragm, respectively;
   a partition plate arranged in the first chamber of the casing and spaced from the diaphragm by a predetermined distance, the partition plate dividing the first chamber of the casing into an upper region spaced away from the diaphragm and a lower region adjacent to the diaphragm, the lower region of the first chamber being filled with a working fluid, the partition plate comprising a nozzle; and
   a piezoelectric element attached to the diaphragm in such a manner that the piezoelectric element can vibrate along directions substantially perpendicular to the top and bottom sides of the diaphragm when a voltage is applied to the piezoelectric element, wherein when the diaphragm is driven to vibrate upwardly by the piezoelectric element, the diaphragm pushes at least some of the working fluid in the lower region of the first chamber into the upper region of the first chamber towards the electronic component via the nozzle,
   wherein the partition plate defines a plurality of reflux holes therein at two opposite sides of the nozzle, the reflux holes communicating the upper region with the lower region, and
   wherein the partition plate has two wings extending outward from the two opposite sides of the nozzle, the reflux holes being defined in the two wings.

9. The electronic device of claim 8, wherein the nozzle is tapered and protrudes upward towards a top plate of the casing.

10. The electronic device of claim 8, wherein the nozzle of the partition plate comprises a top portion, and two connecting portions extending down and outward from two opposite sides of the top portion, the top portion of the nozzle defining at least one jetting hole therein.

11. The electronic device of claim 8, wherein a material of the partition plate is porous, with a plurality of capillary holes defining the reflux holes therein.

12. The electronic device of claim 8, wherein the piezoelectric element is attached to a middle portion of the diaphragm, and the nozzle is located at a middle portion of the partition plate over the piezoelectric element.

13. The electronic device of claim 8, wherein the casing is a rectangular box.

14. The electronic device of claim 8, wherein the casing has a top plate facing the partition plate, the top plate defining a through hole therein corresponding to the nozzle of the partition plate, a bottom portion of the electronic component being received in the through hole of the top plate and being hermetically joined to the top plate.

* * * * *